United States Patent
Riviere et al.

(10) Patent No.: US 7,760,476 B2
(45) Date of Patent: Jul. 20, 2010

(54) THRESHOLD VOLTAGE METHOD AND APPARATUS FOR ESD PROTECTION

(75) Inventors: Antoine Riviere, Pourcieux (FR); Frederic Demolli, Rognac (FR); David Bernard, Aix En Provence (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/759,351

(22) Filed: Jun. 7, 2007

(65) Prior Publication Data

US 2008/0304191 A1   Dec. 11, 2008

(51) Int. Cl.
H02H 9/02   (2006.01)
(52) U.S. Cl. ........................................ 361/56
(58) Field of Classification Search .................... 361/56
See application file for complete search history.

(56) References Cited

U.S. PATENT DOCUMENTS

| | | | |
|---|---|---|---|
| 4,659,944 A | | 4/1987 | Miller, Sr. et al. |
| 4,803,442 A | * | 2/1989 | Hogg ........................ 330/274 |
| 5,013,934 A | * | 5/1991 | Hobrecht et al. ............. 327/527 |
| 5,319,259 A | | 6/1994 | Merrill |
| 5,483,406 A | * | 1/1996 | Bennett et al. ................. 361/56 |
| 5,789,785 A | * | 8/1998 | Ravanelli et al. ............. 257/361 |
| 5,946,177 A | | 8/1999 | Miller et al. |
| 6,608,785 B2 | * | 8/2003 | Chuang et al. ............... 365/201 |
| 6,621,680 B1 | | 9/2003 | Segervall |
| 6,828,766 B2 | | 12/2004 | Corva et al. |
| 6,891,495 B2 | | 5/2005 | Chen et al. |
| 6,972,939 B1 | | 12/2005 | Ho et al. |
| 2002/0131221 A1 | | 9/2002 | Lien et al. |
| 2004/0109270 A1 | * | 6/2004 | Stockinger et al. ............. 361/56 |
| 2004/0109271 A1 | * | 6/2004 | Takeda ........................ 361/56 |

(Continued)

FOREIGN PATENT DOCUMENTS

GB   2427768   1/2007

(Continued)

OTHER PUBLICATIONS

T. Maloney et al., "Novel Clamp Circuits for IC Power Supply Protection," IEEE Transactions-Part C, vol. 19, No. 3, Jul. 1996, pp. 150-161.

(Continued)

*Primary Examiner*—Jared J Fureman
*Assistant Examiner*—Nicholas Ieva
(74) *Attorney, Agent, or Firm*—Schwegman, Lundberg & Woessner, P.A.

(57) ABSTRACT

An electrostatic discharge protection circuit comprises a comparator coupled between a power supply terminal and ground. The comparator responds to an electrostatic discharge event producing a trigger signal at a comparator output. The comparator comprises a first and second current mirror. The first and second current mirrors each comprise a sense device and a mirror device. The mirror devices are coupled in series between the power supply terminal and ground. The first mirror device produces an incident current and the second mirror device receives an absorption current. With a supply voltage on the power supply terminal equal to or greater than a trigger supply voltage, the absorption current exceeds the incident current and produces a trigger signal at the comparator output. The trigger signal activates a shunt device that shunts current from the power supply terminal to ground.

10 Claims, 5 Drawing Sheets

U.S. PATENT DOCUMENTS

| | | | |
|---|---|---|---|
| 2004/0257728 A1 | 12/2004 | Hu | |
| 2006/0209478 A1* | 9/2006 | Arai et al. | 361/56 |
| 2007/0096711 A1* | 5/2007 | Ishii et al. | 323/288 |
| 2007/0109697 A1* | 5/2007 | Huh | 361/56 |
| 2007/0226597 A1* | 9/2007 | Taito et al. | 714/785 |

FOREIGN PATENT DOCUMENTS

| | | |
|---|---|---|
| WO | WO 2008/153971 A1 | 12/2008 |

OTHER PUBLICATIONS

"International Application Serial No. PCT/US2008/007162, International Search Report mailed Nov. 12, 2008", 6 pages.

"International Application Serial No. PCT/US2008/007162, Written Opinion mailed Nov. 12, 2008", 6 pages.

* cited by examiner

THRESHOLD VOLTAGE METHOD AND APPARATUS FOR ESD PROTECTION

TECHNICAL FIELD

A present invention generally relates to electrostatic discharge protection devices for integrated circuits. More specifically, the device is activated by threshold voltage for triggering an electrostatic discharge shunting device.

BACKGROUND ART

It is known in the integrated circuit industry that build up of static charge may lead to development of extremely high voltage near input of an integrated circuit. Electrostatic discharge (ESD) refers to the phenomenon of an electrical discharge of high current over a short duration where the current results from a buildup of static charge on or near the integrated circuit package. ESD is a serious problem for semiconductor devices since it has the potential to destroy the entire integrated circuit. It is important to provide a full-chip method of protection against such damage. The principal difficulty for designers is to make a protection device which would be able to protect the integrated circuit without interfering with nominal chip functionality.

A well-known protection method incorporated for protecting devices is a clamp circuit that connects to the power supply rails and distinguishes the ESD event from electronic signals propagating during normal applications. Distinguishing the ESD event from nominal signals is done by a filter with an RC time constant. However, due to this approach to signal differentiation, rapid rise times occurring during integrated circuit power up are close to the magnitude of rise times of an ESD event. Undesirable triggering of the protection clamping circuit may occur either due to rapid power-on conditions or during high current consumption, such as occurs with simultaneously switching outputs (SSO).

With reference to FIG. 1, a series configuration of a trigger capacitor 115 and a trigger resistor 120 connects between a power supply terminal 105 and ground 110 in a prior art ESD protection circuit 100. An ESD inverter 130 and a trigger latch 140 each connect between the power supply terminal 105 and ground 110. An ESD trigger line 125 connects between a series connection node (between the trigger capacitor 115 and the trigger resistor 120) and an input of the ESD inverter 130. A trigger line 135 connects between an output of the ESD inverter 130 and an input of the trigger latch 140. An ESD shunt device 145 connects between the power supply terminal 105 and ground 110. An ESD shunt trigger line 150 connects between an output of the trigger latch 140 and an input of the ESD shunt device 145.

The ESD protection circuit 100 uses an RC time constant to trigger the ESD shunt device 145, but uses the trigger latch 140 to maintain a triggered state of the ESD shunt device 145. Separating the ESD trigger elements (i.e., the trigger capacitor 115, the trigger resistor 120, and the ESD inverter 130) from an element sustaining the ESD trigger state (i.e., the trigger latch 140), means an RC time constant for triggering can be reduced by a factor of 100. Reduction of an RC time constant helps to eliminate risk of an accidental trigger during a rapid (on the order of hundreds of nanoseconds) power-on of a system. RC time constant reduction does not help in differentiating between ESD events with rise times similar to power-on events. An additional benefit of a reduction in an RC time constant is less risk of false triggering during switching, which produces noise (on an order of nanoseconds) on the power supply terminal 105 and is caused by simultaneously switching outputs (SSO).

The ESD protection circuit 100 requires additional timeout circuitry (not shown) which produces a release of the trigger latch 140 typically after a few microseconds delay. A timeout circuit is required to release the trigger latch 140 in cases where false triggering has occurred due to RLC noise generation or IR drop during SSO.

What is needed is a triggering mechanism that properly triggers ESD shunting devices yet allows a rapid power-on of a device without a particular requirement for power-on slew rates below a certain minimum. Furthermore, false triggering of the ESD devices should be avoided during SSO events. It is also desirable to have an ESD shunt triggering mechanism that is not a function of RC parasitic components and thus avoids any processing variation in these component values as well as the corresponding expense in required chip area.

SUMMARY

A first exemplary embodiment of an ESD protection circuit comprises a shunt device coupled between a power supply terminal and ground, the shunt device capable of shunting current from the power supply terminal to ground in response to a trigger signal received at a shunt device input, a latch coupled to the shunt device input, the latch capable of latching the trigger signal received at a latch input, a buffer coupled to the latch input, the buffer capable of receiving the trigger signal at a buffer input, and a comparator coupled between the power supply terminal, ground, and the buffer input, the comparator capable of responding to an electrostatic discharge event and producing the trigger signal at a comparator output.

A second exemplary embodiment is an ESD protection circuit comprising a means for shunting coupled between a power supply terminal and ground, a means for retaining a logic signal level, the retaining means coupled to the shunting means, a means for buffering coupled to the retaining means, a means for triggering coupled to the buffering means, and a means for detecting coupled to the triggering means, the detecting means further comprising a first and second means for mirroring a current and a plurality of means for biasing.

An exemplary method of protecting a device from electrostatic discharge, the method comprising applying an electrostatic discharge to a power supply terminal coupled to a current comparator, sensing a first sense current flowing through a first sense device of a first current mirror, producing a mirror current through a first mirror device of the first current mirror, producing a bias voltage from the first sense current flowing through a plurality of bias devices, sensing a second sense current flowing through a second sense device of a second current mirror, accepting the first sense current through a second mirror device of the second current mirror, and producing a trigger signal at an output of the current comparator.

DETAILED DESCRIPTION

Figure 1:
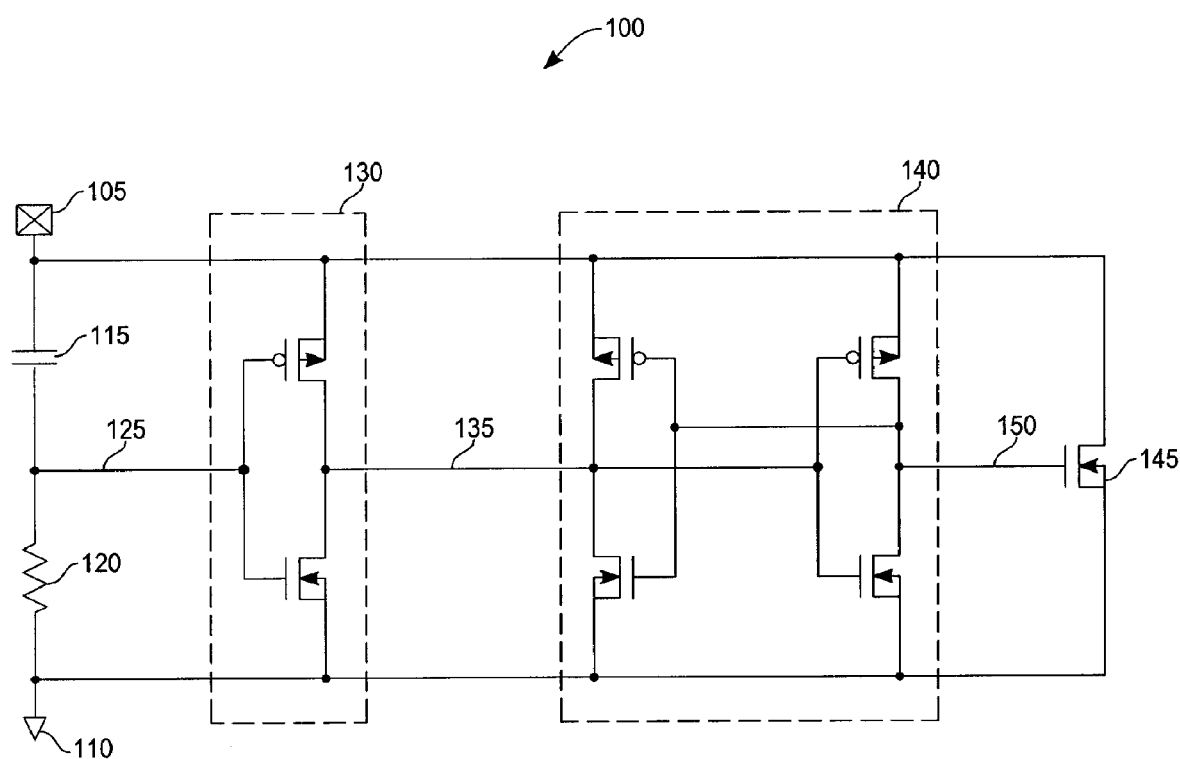
FIG. 1 is a schematic diagram of a first prior art shunting circuit for ESD protection.
Figure 2:
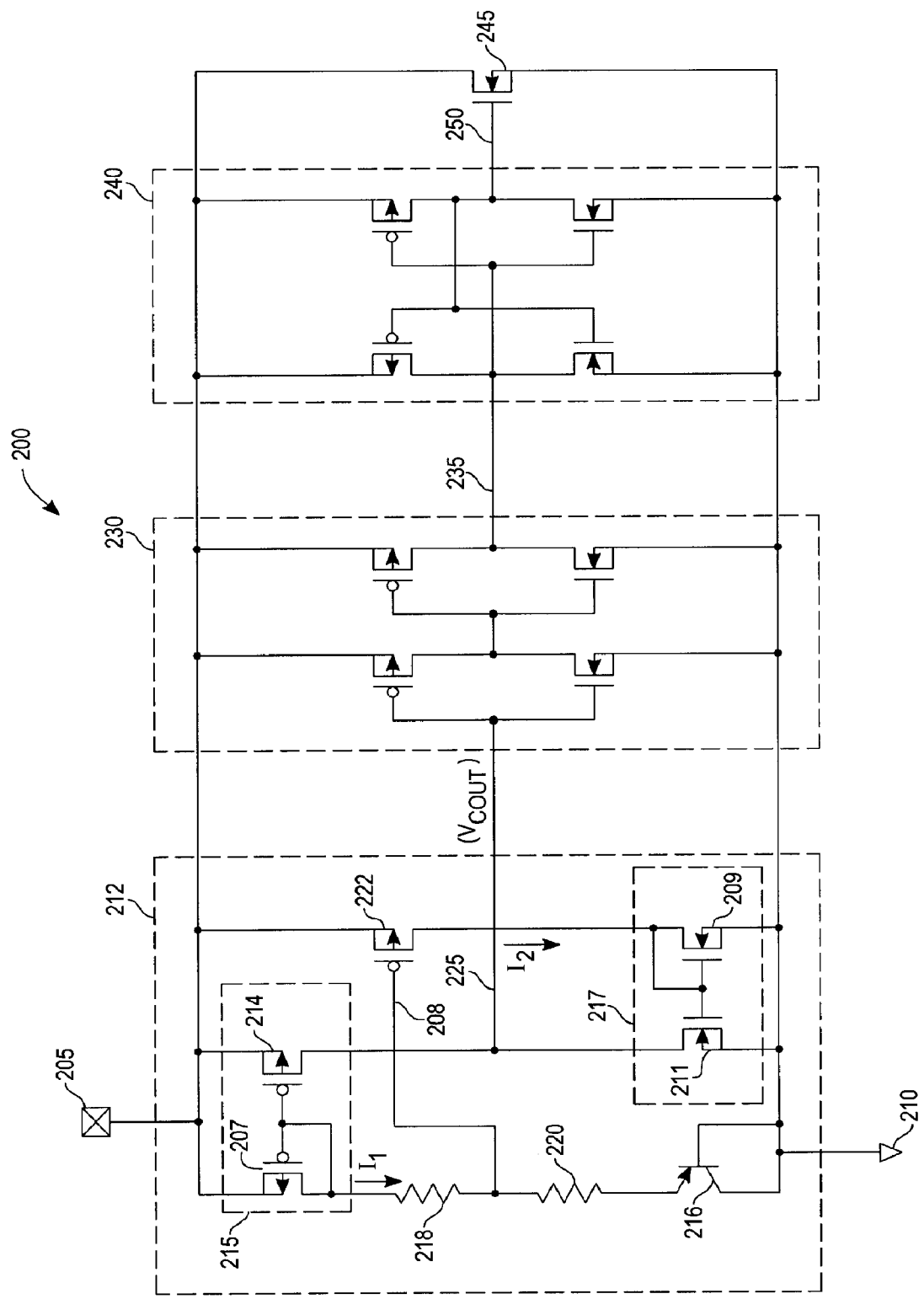
FIG. 2 is a schematic diagram of an exemplary ESD event shunting circuit according to the present invention.

With reference to FIG. 2, a comparator 212 connects between a power supply terminal 205 and ground 210 in an exemplary ESD protection circuit 200. A buffer 230 and a latch 240 each connect between the power supply terminal 205 and ground 210. A comparator output line 225 connects between an output of the comparator 212 and an input of the buffer 230. A trigger line 235 connects between an output of the buffer 230 and an input of the latch 240. A shunt device 245 connects between the power supply terminal 205 and ground 210. A shunt trigger line 250 connects between an output of the latch 240 and an input of the shunt device 245.

The buffer 230 is, for example, a succession of two CMOS inverters in series between the comparator output line 225 and the trigger line 235. The latch 240 is, for example, a cross coupled set of CMOS inverters with a latch input at the trigger line 235 and a latch output coupled to the shut trigger line 250.

In the present exemplary embodiment the comparator 212 comprises a first current mirror 215 coupled between the power supply terminal 205, a first trigger resistor 218, and the comparator output line 225. A second trigger resistor 220 is coupled in series with the first trigger resistor 218 at a bias output line 208. The second trigger resistor 220 is coupled to a compensating device 216.

The first current mirror 215 has a first sense device 207 coupled between the power supply terminal 205 and the first trigger resistor 218. The first current mirror 215 also has a first mirror device 214 coupled between the power supply terminal 205 and the comparator output line 225. The first sense device 207 and the first mirror device 214 may be, for example, PMOS transistors.

The comparator 212 further comprises a second current mirror 217 with a second sense device 209 coupled between a transconductance device 222 and ground 210. Within the second current mirror 217, a second mirror device 211 is coupled between the comparator output line 225 and ground 210. The second sense device 209 and the second mirror device 211 may be, for example, NMOS transistors.

The compensating device 216 serves as a voltage compensating device where variation in voltage across the compensating device 216 tracks, and thus compensates for, corresponding temperature variation in a threshold voltage of the first sense device 207. The compensating device 216 may be, for example, a bipolar transistor. Implemented as a bipolar transistor, the compensating device 216 couples to ground 210 in a diode configuration (i.e., with a transistor base terminal coupled to ground 210).

The first and second trigger resistors 218, 220 are generally incorporated as bias devices. The first trigger resistor 218 may be, for example, 80 kilohms and the second trigger resistors 220 may be, for example, 1.2 megohms. These values are suited to, for example, a 0.18 micrometer (um) technology with a VDD supply voltage level of 3.3 volts (V). Generally, a given magnitude of VDD supply voltage level may affect selection of the values of the first or second trigger resistors 218, 220. One of the first or second trigger resistors 218, 220 being in the megohm range, for example, assures a limited current consumption by the ESD protection circuit during nominal operation (i.e., during non-ESD operation). A plurality of bias devices may be used in various configurations contrived by one skilled in the art to derive a voltage on the bias output line 208 capable of supplying a bias voltage suitable for operating the transconductance device 222.

A skilled artisan may conceive of other solid-state devices, such as field effect transistors, that would suitably equate to the PMOS or NMOS transistors utilized in the first current mirror 215 or the second current mirror 217 respectively. For example, an insulated gate device would be capable of being configured with a gate input connected to a drain node in a first device, for instance a sense device, with an identical device coupled at a gate input forming a mirror device. Other such equivalents may be contemplated by the skilled artisan that would suitably equate to a sense and mirror device.

A transconductance device input is coupled to the power supply terminal 205 and a control input of the transconductance device 222 is coupled to the bias output line 208. An output of the transconductance device 222 couples to the second sense device 209 of the second current mirror 217.

The ESD protection circuit 200 incorporates the comparator 212 to trigger the shunt device 245 and uses the latch 240 to maintain a triggered state of the shunt device 245. The ESD protection circuit 200 does not require additional timeout circuitry to release the latch 240 after a few microseconds delay, which is typically the case where passive components set the latch 240. A timeout circuit is required to release a latch in cases of prior art circuits where false triggering has occurred due to RLC noise generation or IR drop during SSO. The exemplary triggering mechanism provided by the comparator 212 avoids such a requirement.

Figure 3:
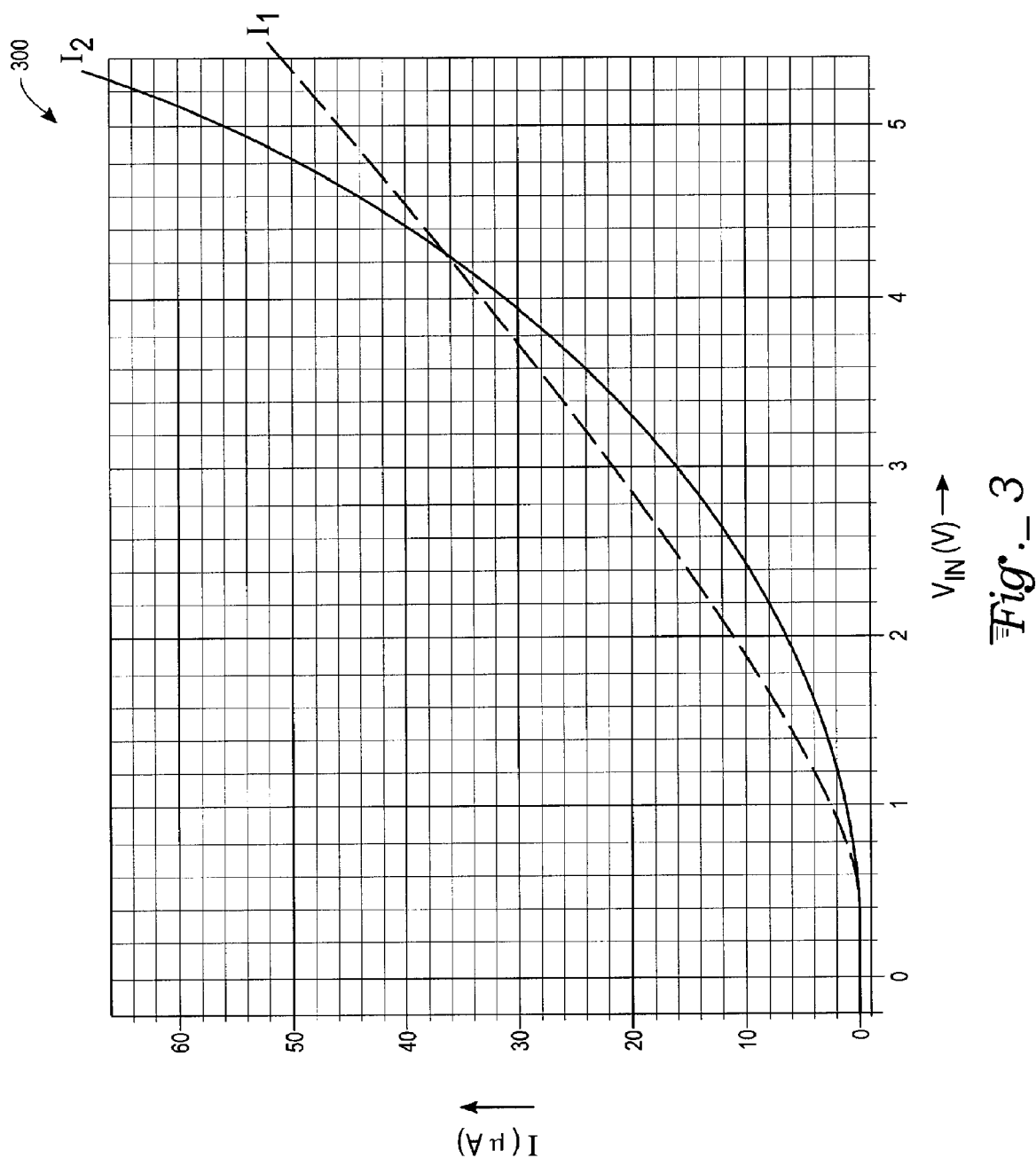
FIG. 3 is a current diagram of exemplary circuit elements according to FIG. 2.

With reference to FIG. 3, a first sense current $I_1$ (FIG. 2) overlays a second sense current $I_2$ in an exemplary current vs. voltage diagram 300. The abscissa represents an input voltage $V_{IN}$ on the power supply terminal 205. For any extent of the input voltage $V_{IN}$ beyond a magnitude of expected power supply voltage $V_{DD}$, the input voltage $V_{IN}$ may be seen to represent an applied voltage corresponding to an ESD event on the power supply terminal 205. The first sense current $I_1$ increases, for example, essentially linearly from a point where the input voltage $V_{IN}$ is about 0.8 volts (V) through the full range of voltage depicted. The linear characteristic of the first sense current $I_1$ comes from the resistive electrical characteristics of an on-channel resistance within the first current mirror 215, the first trigger resistor 218, and the second trigger resistor 220.

The second sense current $I_2$ increases, for example, in a quadratic fashion from a point where the input voltage $V_{IN}$ is about 0.8 V through the full range of the input voltage $V_{IN}$ depicted. The quadratic characteristic is due to the inherent electrical characteristics of the transconductance device 222. The transconductance device may be, for example, a PMOS transistor operating in a saturation realm. The current characteristic of a PMOS transistor in this realm is a function of the $(V_{GS}-V_{TH})^2$ type of relationship for the device and so follows the quadratic nature of the current behavior versus the input voltage $V_{IN}$ behavior. In addition, the transconductance device may be, for example, a PMOS transistor operating in a linear conduction realm.

In continuing reference to FIG. 3, for the input voltage $V_{IN}$ ranging from 0.8 V to about 4.3 V, a first sense current $I_1$ exceeds a second sense current $I_2$ for the exemplary comparator 212 (FIG. 2). Since the first mirror device 214 of the first current mirror 215 is coupled in series with the second mirror device 211 of the second current mirror 217, the current through each mirror device is equal. The first mirror device 214 produces an incident current and the second mirror device 211 accepts an absorption current.

The incident current is a measure of the propensity of the first sense current $I_1$ to produce a mirror current in the first mirror device 214. Similarly, the absorption current is a measure of the propensity of the second sense current $I_2$ to induce acceptance of a series current through the second mirror device 211. For a given input voltage $V_{IN}$ applied at the power supply terminal 205, the first sense current $I_1$ is not equal to the second sense current $I_2$ (except at a cross over point, which is explained below).

Since the two mirror currents flowing through the series combination of the respective mirror devices 211, 214 are equal (since they are the same current), the greater of the two sense currents $I_1$, $I_2$ prevails in producing the resultant series current through the mirror devices 211, 214. This comes about since the (relatively) greater of the two internal mirror voltages (not shown) within each current mirror 215, 217 is in effect producing the lower impedance through a corresponding one of the two mirror devices 211, 214.

Consequently, at a given operating condition of input voltage $V_{IN}$ on the power supply terminal 205, the one of the two current sense devices 207, 209 capable of inducing the greater mirror current has a relatively smaller voltage drop across the corresponding one of the two mirror devices 211, 214. The mirror device with the smaller voltage drop across it determines the series current through the two mirror devices 211, 214. The resulting current flowing through the remaining mirror device sustains a greater voltage drop across the device. This scenario provides the behavior of a voltage on the comparator output line $V_{COUT}$ (FIG. 2).

For a range of input voltage $V_{IN}$ from about 0.8 V to about 4.3 V there is less voltage across the first mirror device 214 than there is across the second mirror device 211. This produces a high output level for the voltage on the comparator output line $V_{COUT}$. With a high level comparator output voltage $V_{COUT}$, a corresponding high voltage level is produced on the trigger line 235 and a low voltage level is produced on the shunt trigger line 250. Therefore, for $V_{IN}$ ranging from 0.8-4.3 V the shunt device 245 is off leaving voltage on the power supply terminal 205 at a nominal supply voltage, for example, VDD. As the input voltage $V_{IN}$ ranges from about 0.8 V to about 4.3 V, for example, $V_{COUT}$ closely approximates $V_{IN}$ in magnitude.

In contrast, for $V_{IN}$ above a magnitude, for example, of 4.3 V, the above characteristics take on complementary relationships since the second mirror device 211 is capable of conducting more current than the first mirror device 214 in this realm. For an increasing magnitude of input voltage $V_{IN}$, a cross over point or a trigger supply voltage (considering that the input voltage $V_{IN}$ is applied to the power supply terminal 205) is defined where the second mirror device 211 begins to be capable of conducting more current than the first mirror device 214.

Therefore, above the trigger supply voltage, the voltage across the second mirror device 211 is less than the voltage across the first mirror device 214. A condition follows that the comparator output voltage $V_{COUT}$ is at a low level and the shunt device 245 is turned on. With the shunt device 245 turned on, high levels of $V_{IN}$, for example above 4.3 V, the power supply terminal 205 is shunted to ground through the shunt device 245. High levels of $V_{IN}$ that produce the protective shunting effect, produced by the shunt device 245, correspond with elevated voltages like those produced by an ESD event on the power supply terminal 205. That is, the ESD protection circuit 200 produces protection against elevated voltages such as those of an ESD event. The protection is derived from a threshold voltage detection provided by a current comparator.

The characteristics of the first and second sense currents $I_1$, $I_2$ verses input voltage $V_{IN}$ may be complementary to the two instances given. The first sense current $I_1$ may increase, for example, in a quadratic fashion and the second sense current $I_2$ may increase, for example, in an essentially linear fashion. One skilled in the art may readily envision any of a number of types of functional variation of a sense current provided by current sensing devices where a cross over point is present in the combined sense current characteristics.

Figure 4:
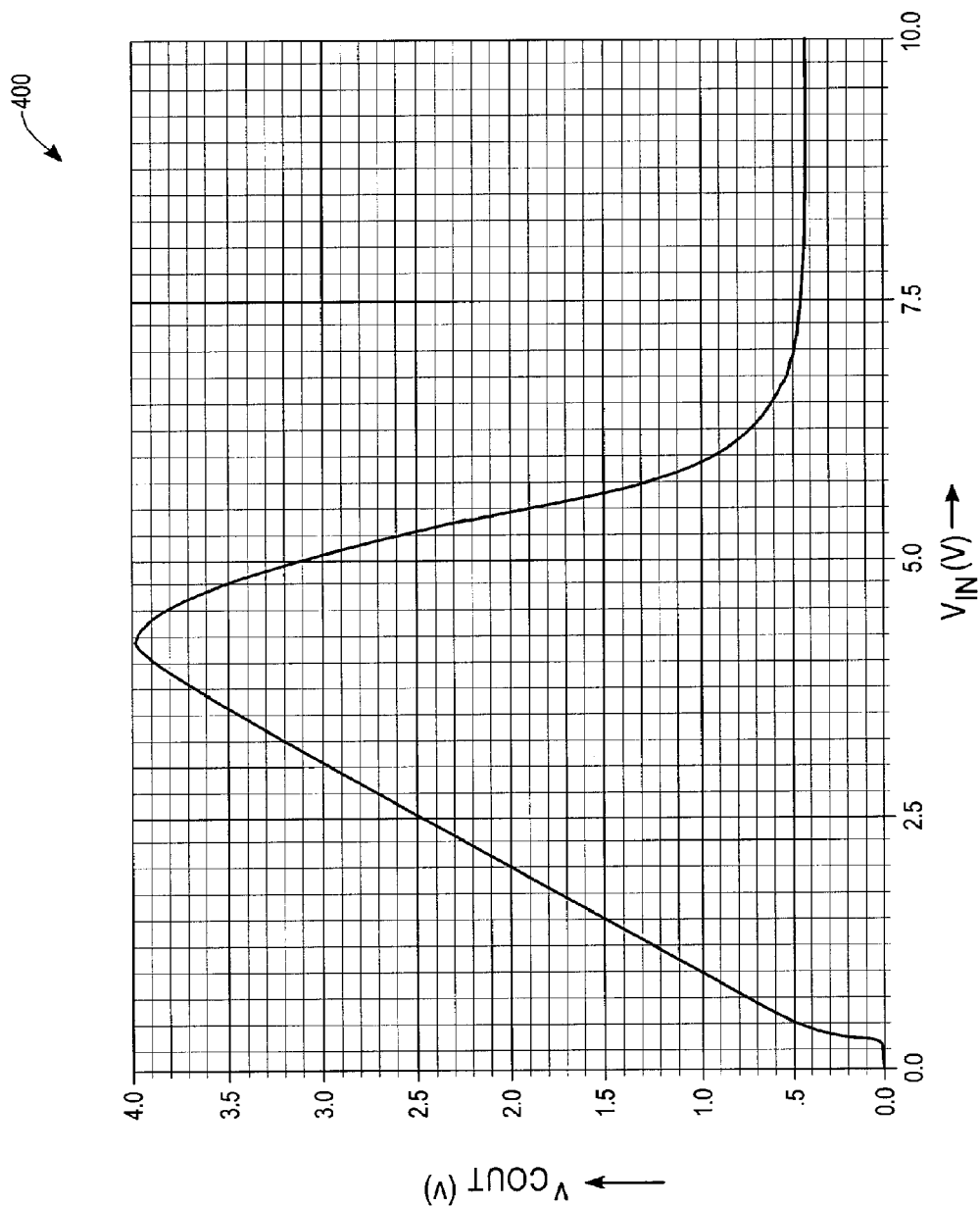
FIG. 4 is an output voltage diagram of an exemplary current comparator according to FIG. 2.

With reference to FIG. 4, a comparator output voltage $V_{COUT}$ attains a peak value prior to an input voltage $V_{IN}$ attaining a magnitude of 5 V in an exemplary comparator output voltage versus input voltage diagram 400. For $V_{IN}$ ranging from about, for example, 0.8-4.3 V, the shunt device 245 is off leaving voltage on the power supply terminal 205 at a nominal supply voltage, for example, VDD. Therefore, as the input voltage $V_{IN}$ ranges from about 0.8 V to about 4.3 V, for example, $V_{COUT}$ closely approximates $V_{IN}$ in magnitude.

Subsequent to the input voltage $V_{IN}$ attaining a magnitude of about, for example, 4.3 V, the comparator output voltage $V_{COUT}$ reduces to about 0.4 V for the input voltage $V_{IN}$ exceeding about 8 V. Above about the 4.3 V level for $V_{IN}$, the comparator output voltage $V_{COUT}$ is a trigger signal or ESD trigger voltage capable of causing the ESD protection circuit 200 (FIG. 2) to activate the shunt device 245. For $V_{IN}$ below about the 4.3 V level, and since $V_{COUT}$ closely approximates $V_{IN}$ for $V_{IN}$ ranging from about 0.8 V to about 4.3 V, $V_{COUT}$ does not vary from $V_{IN}$ enough to cause a trigger signal on the shunt trigger line 250.

Figure 5:
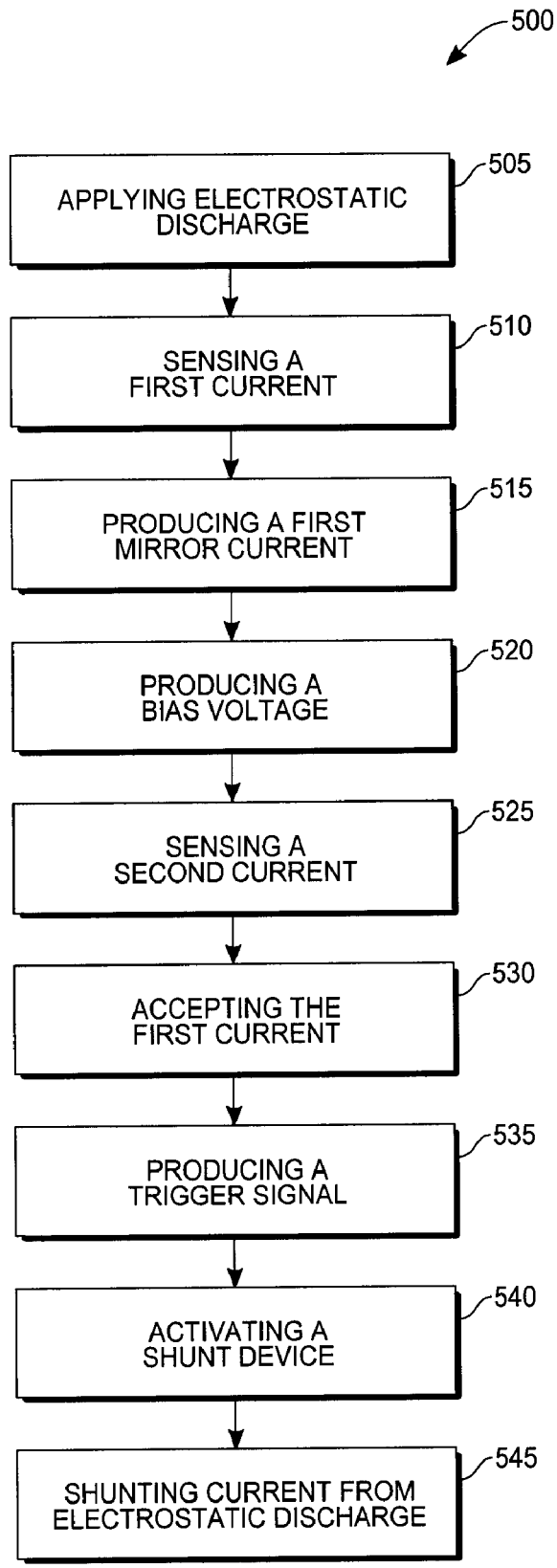
FIG. 5 is an exemplary process flow diagram of a method for triggering protection from ESD events utilizing the circuit of FIG. 2.

With reference to FIG. 5, applying an electrostatic discharge to a power supply terminal 505 is a first step in an exemplary method of protecting a device from electrostatic discharge 500. A next step is sensing a first sense current flowing through a first sense device 510 followed by a step of producing a mirror current through a first mirror device 515. A continuing step is producing a bias voltage from the first sense current 520 followed by a step of sensing a second sense current flowing through a second sense device 525. A subsequent step is accepting the first sense current through a second mirror device 530 and next producing a trigger signal at an output of the current comparator 535. A next step is taken of activating a shunt device coupled between the power supply terminal and ground 540 followed by shunting current from the electrostatic discharge to ground 545.

It would be clear to one of skill in the art that alternate embodiments of the above detailed description may exist. Therefore, the above description is illustrative and not restrictive. The scope of the invention should therefore be determined by reference to the appended claims and not by the above description.

What is claimed is:

1. An electrostatic discharge protection circuit, comprising:

a shunt device coupled between a power supply terminal and ground, the shunt device capable of shunting current from the power supply terminal to ground in response to a trigger signal received at a shunt device input;

a latch coupled to the shunt device input, the latch capable of latching the trigger signal received at a latch input;

a buffer coupled to the latch input, the buffer capable of receiving the trigger signal at a buffer input;

a comparator coupled between the power supply terminal, ground, and the buffer input, the comparator capable of responding to an electrostatic discharge event and producing the trigger signal at a comparator output, wherein the comparator comprises:

a first current mirror comprising a first sense device coupled to the power supply terminal and a first mirror device coupled between the comparator output and the power supply terminal;

a plurality of bias devices coupled to the first sense device, at least two of the plurality of bias devices coupled in series at a bias output line;

a transconductance device comprising an input coupled to the power supply terminal and a control input coupled to the bias output line;

a second current mirror comprising a second sense device coupled between the transconductance device and ground and a second mirror device coupled between the comparator output and ground, the second mirror device coupled in series with the first mirror device; and a compensating device coupled between the plurality of bias devices and ground.

2. The electrostatic discharge protection circuit of claim 1, wherein the plurality of bias devices is capable of producing a bias voltage on the bias output line proportionate to a first sense current flowing through the first sense device and the plurality of bias devices, the bias voltage determining a second sense current flowing through the transconductance device.

3. The electrostatic discharge protection circuit of claim 1, wherein the comparator is capable of producing the trigger signal at the comparator output based on a current flowing through the first mirror device and the second mirror device.

4. The electrostatic discharge protection circuit of claim 1, wherein a resultant current through the series coupled mirror devices activates the trigger signal.

5. The electrostatic discharge protection circuit of claim 1, wherein the first mirror device is capable of producing an incident current and the second mirror device is capable of accepting an absorption current.

6. The electrostatic discharge protection circuit of claim 1, wherein the series coupling of mirror devices is capable of producing a resultant current equal to the greater of an incident current flowing through the first mirror device or an absorption current flowing through the second mirror device.

7. The electrostatic discharge protection circuit of claim 6, wherein the trigger signal is activated when the absorption current is greater than the incident current.

8. The electrostatic discharge protection circuit of claim 1, wherein a first sense current through the first sense device produces an incident current through the first mirror device and a second sense current through the second sense device produces an absorption current through the second mirror device.

9. The electrostatic discharge protection circuit of claim 1, wherein the first mirror device is capable of producing an incident current less than an absorption current through the second mirror device with a supply voltage on the power supply terminal equal to or greater than a trigger supply voltage, the absorption current exceeding the incident current producing the trigger signal at the comparator output activating the shunt device.

10. The electrostatic discharge protection circuit of claim 1, wherein the compensating device is capable of compensating a temperature dependent variation of a threshold voltage of the first sense device, the compensating device providing a voltage drop across the compensating device corresponding to the voltage drop across the first sense device due to temperature variation.

* * * * *